United States Patent
Drost et al.

(10) Patent No.: US 7,994,501 B2
(45) Date of Patent: *Aug. 9, 2011

(54) METHOD AND APPARATUS FOR ELECTRONICALLY ALIGNING CAPACITIVELY COUPLED MINI-BARS

(75) Inventors: Robert J. Drost, Mountain View, CA (US); Ivan E. Sutherland, Santa Monica, CA (US); William S. Coates, Los Gatos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 620 days.

This patent is subject to a terminal disclaimer.

(21) Appl. No.: 12/114,404

(22) Filed: May 2, 2008

(65) Prior Publication Data
US 2008/0208521 A1 Aug. 28, 2008

Related U.S. Application Data

(62) Division of application No. 11/125,792, filed on May 9, 2005, now Pat. No. 7,384,804.

(51) Int. Cl.
*H01L 23/58* (2006.01)
*H01L 29/10* (2006.01)
(52) U.S. Cl. .......................... 257/48; 257/686
(58) Field of Classification Search .............. 257/48, 257/686
See application file for complete search history.

(56) References Cited

U.S. PATENT DOCUMENTS

| | | | |
|---|---|---|---|
| 5,629,838 A | 5/1997 | Knight et al. | |
| 6,559,531 B1 | 5/2003 | Sutherland | |
| 6,600,325 B2 | 7/2003 | Coates et al. | |
| 6,728,113 B1 | 4/2004 | Knight et al. | |
| 6,812,046 B2 * | 11/2004 | Drost et al. ............. | 438/14 |
| 6,916,719 B1 | 7/2005 | Knight et al. | |
| 7,276,928 B2 | 10/2007 | Neaves et al. | |
| 2003/0065473 A1 | 4/2003 | Kux et al. | |
| 2004/0018654 A1 | 1/2004 | Drost et al. | |
| 2005/0054139 A1 | 3/2005 | Drost et al. | |

\* cited by examiner

*Primary Examiner* — Alexander G Ghyka
*Assistant Examiner* — Seahvosh J Nikmanesh
(74) *Attorney, Agent, or Firm* — Park, Vaughan, Fleming & Dowler LLP

(57) ABSTRACT

Embodiments of the present invention provide a system that electronically aligns mini-bars on different semiconductor chips which are situated face-to-face to facilitate communication between the semiconductor chips through capacitive coupling. During operation, the system selects a group of transmitter mini-bars on the first chip to form a transmitter bit position and selects a group of receiver mini-bars on the second chip to form a receiver bit position. The system then associates transmitter bit positions on the first chip with proximate receiver bit positions on the second chip. In this way, the system allows data signals transmitted by the mini-bars within a transmitter bit position on the first chip to be collectively received by the mini-bars within an associated receiver bit position on the second chip.

8 Claims, 5 Drawing Sheets

METHOD AND APPARATUS FOR ELECTRONICALLY ALIGNING CAPACITIVELY COUPLED MINI-BARS

RELATED APPLICATION

The subject matter of this application is a divisional under 37 C.F.R. §1.53(b) of, and claims priority under 35 U.S.C. §121 to, a co-pending non-provisional application by the same inventors as the instant application, entitled "Method and Apparatus for Electronically Aligning Capacitively Coupled Mini-Bars," having Ser. No. 11/125,792 and filing date 9 May 2005.

BACKGROUND

1. Field of the Invention

The present invention relates to the process of transferring data between integrated circuits. More specifically, the present invention relates to a method and an apparatus for aligning capacitive transmitter mini-bars on a first chip with capacitive receiver mini-bars on a second chip to facilitate compensation for variations in alignment between the first chip and the second chip.

2. Related Art

Advances in semiconductor technology presently make it possible to integrate large-scale systems into a single chip. Such integration can potentially increase the operating speed of the system, because signals between system components do not have to travel across chip boundaries, and therefore are not subject to lengthy chip-to-chip propagation delays. Moreover, integrating large-scale systems into a single chip significantly reduces production costs, because fewer semiconductor chips are required to perform a given computational task.

Unfortunately, these advances in integration technology have not been matched by corresponding advances in inter-chip communication technology. Semiconductor chips are typically soldered onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This communication bottleneck is expected to worsen as chip integration densities continue to increase.

To overcome this bottleneck, researchers have begun to investigate alternative techniques for inter-chip communications. One promising technique is to transmit signals through arrays of capacitively coupled transmitter and receiver pads. If a first chip is mounted face-to-face with a second chip so that transmitter pads on the first chip are capacitively coupled with receiver pads on the second chip, it becomes possible to transmit signals directly from the first chip to the second chip without having to route the signal through intervening signal lines through a printed circuit board.

However, it is not a simple matter to align the chips properly. One alignment technique is to reduce the size of transmitter pads and to arrange them in a dense array. These smaller transmitter pads communicate with larger receiver pads. When two chips are aligned, only those transmitter pads that can capacitively couple with proximate receiver pads are driven with signals to transmit. In this way, misalignment of the receiver pad can be compensated for by selectively activating transmitter pads which substantially overlap with a receiver pad (see FIG. 2).

Unfortunately, this approach has limitations, especially as the number of bit positions increases. (A bit position is one capacitively coupled communication channel, which is capable of communicating a single bit-serial signal.) A switching circuit is typically used to selectively transmit different signals through transmitter pads to a targeted receiver pad. As the number of bit positions increases, there are two ways to accommodate more receiver pads. One way is to increase the coverage resolution of the transmitter pads, so that more receiver pads can be packed into a given area without too much interference. This translates to more, smaller transmitter pads, and a denser transmitter-pad array. The other way is to take up more chip-surface area to accommodate more receiver pads. Either approach causes the number of transmitter pads, and therefore the corresponding complexity of the switching circuitry, to increase non-linearly. Therefore, this is not a very scalable solution.

Hence, what is needed is a scalable approach for effectively aligning two chips for communications through capacitive coupling without introducing complex switching circuitry within the transmitting chip.

SUMMARY

One embodiment of the present invention provides a system that electronically aligns mini-bars on different semiconductor chips which are situated face-to-face to facilitate communication between the semiconductor chips through capacitive coupling. During operation, the system measures an alignment between a first chip and a second chip. The system then selects a group of transmitter mini-bars on the first chip to form a transmitter bit position based on the measured alignment. In this way, the system allows a data signal to be distributed to and transmitted by the mini-bars that form the transmitter bit position. The system also selects a group of receiver mini-bars on the second chip to form a receiver bit position based on the measured alignment. Next, the system associates transmitter bit positions on the first chip with proximate receiver bit positions on the second chip based on the measured alignment. In this way, the system allows data signals transmitted by the mini-bars within a transmitter bit position on the first chip to be collectively received by the mini-bars within an associated receiver bit position on the second chip.

In a variation on this embodiment, the system switches data signals to associated transmitter bit positions on the first chip, so that the data signals are communicated through capacitive coupling to intended receiver bit positions on the second chip, which are proximate to the transmitter bit positions on the first chip.

In a variation on this embodiment, the system switches data signals received by the receiver mini-bars to associated receiver circuits, so that data signals belonging to the same receiver bit position are received collectively.

In a variation on this embodiment, the transmitter mini-bars on the first chip form a number of columns, each comprising multiple parallel mini-bars, thereby allowing the first chip to adjust the transmitter bit positions in the direction along the columns. Similarly, the receiver mini-bars on the second chip form a number of rows, each comprising multiple parallel mini-bars, thereby allowing the second chip to adjust the receiver bit positions in the direction along the rows. Furthermore, the system aligns the first chip and the second chip so that the transmitter mini-bars on the first chip are orthogonal to the receiver mini-bars on the second chip, thereby allowing the position of an overlap between a transmitter bit position and a receiver bit position to be adjusted in two orthogonal directions.

In a further variation, selecting a group of transmitter mini-bars on the first chip to form the transmitter bit position involves assigning a number of consecutive transmitter mini-bars within a column to the transmitter bit position; and coupling a data signal switched to the transmitter bit position to the group of consecutive transmitter mini-bars assigned to the transmitter bit position.

In a further variation, selecting a group of receiver mini-bars on the second chip to form the receiver bit position involves assigning a number of consecutive receiver mini-bars within a row to the receiver bit position.

In a further variation, the total number of transmitter mini-bars on the first chip exceeds the number of transmitter mini-bars selected to form transmitter bit positions. This provides room for relocating the transmitter bit positions. In addition, the system couples transmitter mini-bars which are not selected to a fixed voltage, such as a power-supply voltage or a ground voltage.

In a further variation, the total number of receiver mini-bars on the second chip exceeds the number of receiver mini-bars selected to form receiver bit positions. This provides room for relocating the receiver bit positions. In addition, the system couples receiver mini-bars which are not selected to a fixed voltage, such as a power-supply voltage or a ground voltage.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage device or medium that can store code and/or data for use by a computer system. This includes, but is not limited to, magnetic and optical storage devices such as disk drives, magnetic tape, CDs (compact discs) and DVDs (digital versatile discs or digital video discs).

Inter-Chip Communication Through Capacitive Coupling

Figure 1:
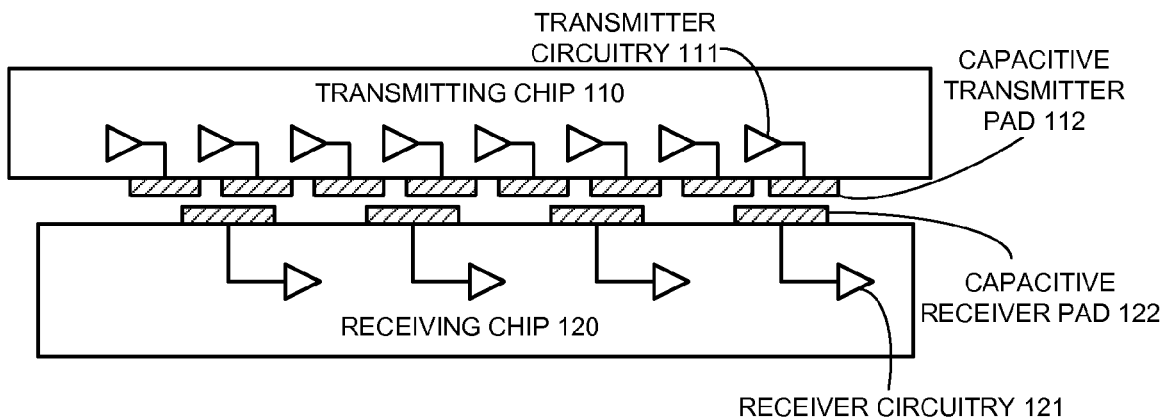
FIG. 1 illustrates inter-chip communication through capacitive pads.

FIG. 1 illustrates inter-chip communication through capacitive pads. A transmitting chip 110 contains transmitter circuitry 111, which feeds a signal into a capacitive transmitter pad 112. The signal is capacitively transmitted to capacitive receiver pad 122, and then passes into receiver circuitry 121, which is located in receiving IC chip 120. Note that when the transmitter and receiver pads are properly aligned, there is no direct physical contact between the transmitter and receiver pads; signals are transmitted through capacitive coupling.

One way to mitigate the effect of misalignment between the transmitter pads and receiver pads is to reduce the size of transmitter pads and to arrange them in an array. Meanwhile, the receiver pads have a larger size and are positioned sparsely. In this way, one can ensure that even with misalignment, a receiver pad can still overlap with a number of transmitter pads and obtain sufficient capacitive coupling. The overlapped transmitter pads are activated to transmit signals. Because a transmit pad may overlap with different receiver pads, and thus may belong to different bit positions due to different misalignment positions, a switching circuit is typically used to switch different signals onto a transmitting pad.

Figure 2:
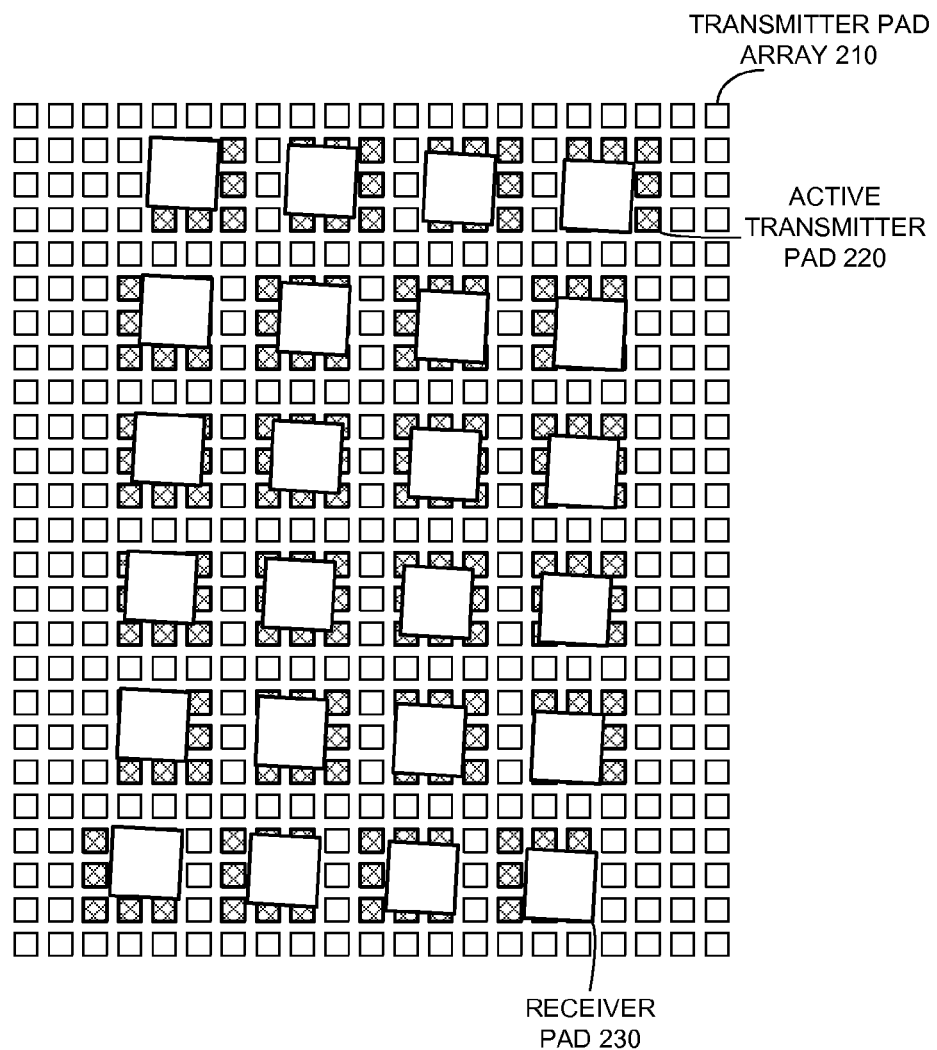
FIG. 2 illustrates compensation for rotational and lateral misalignment between receiver pads and transmitter pads.

FIG. 2 illustrates compensation for rotational and lateral misalignment between receiver pads and a transmitter-pad array. In this example, a receiver pad, such as receiver pad 230, overlaps with approximately nine transmitter pads. To compensate for misalignment, a transmitter array 210 includes a dense array of transmitter pads with smaller sizes. When a transmitter pad is in the vicinity of a receiver pad, it is activated and becomes one of the nine active transmitter pads, which collectively transmit a common signal to the targeted receiver pad. Note that in FIG. 2, active transmitter pads (such as transmitter pad 220) are highlighted with cross-hatching. This arrangement ensures that the receiver pads are properly covered in spite of moderate lateral and rotational misalignments.

One drawback of providing such a transmitter-pad array and using one receiver pad for each bit position is lack of scalability. When the number of bit positions increases, either the resolution of the transmitter-pad array becomes finer, or the total coverage area becomes larger. In either case, the total number of transmitter pads grows rapidly, and so does the complexity of the signal-switching circuitry serving each transmitter pad.

Using Mini-Bars on Both Transmitter Chip and Receiver Chip

One approach to mitigate the complexity of this switching circuitry in the transmitting chip is to spread the burden of switching signals to both the transmitting chip and the receiving chip. One embodiment of the present invention uses substantially rectangular-shaped capacitive pads (denoted as mini-bars) on both chips, thereby allowing one chip to compensate for misalignment in the x direction, and the other chip to compensate for misalignment in the y direction.

Figure 3:
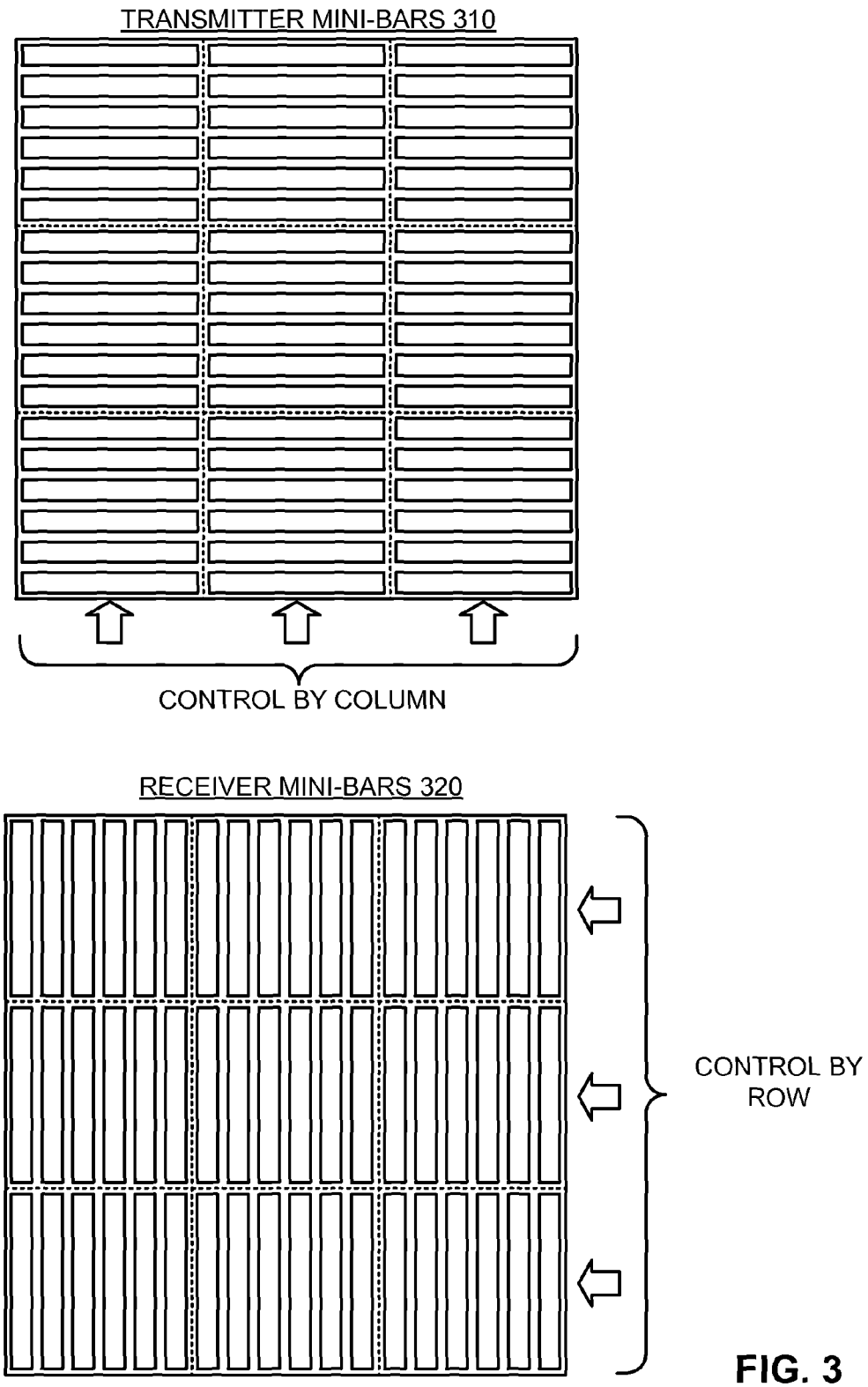
FIG. 3 illustrates an arrangement of transmitter mini-bars and receiver mini-bars in accordance with an embodiment of the present invention.

FIG. 3 illustrates such arrangement of transmitter mini-bars and receiver mini-bars in accordance with an embodiment of the present invention. As shown on the top of FIG. 3, transmitter mini-bars 310 are arranged in columns. Each column comprises a number of parallel horizontal mini-bars. Similarly, receiver mini-bars 320 are arranged in rows. Each row comprises a number of parallel vertical mini-bars. In this example, a bit position contains 6 mini-bars. Note that although the boundaries between bit positions are illustrated by dotted lines in FIG. 3, bit positions can be easily adjusted in the direction orthogonal to its mini-bars. In addition, the size, shape, and density of mini-bars on the transmitting chip can be different from those on the receiving chip.

When two chips are aligned, they are positioned in such a manner that the transmitter mini-bars and the receiver mini-bars are orthogonal to each other. In this way, the transmitting chip can adjust the transmitter bit positions in the column direction, and the receiving chip can adjust the receiver bit positions in the row direction. The combined effect of such adjustments is to produce a substantial alignment between the transmitter bit position and the receiver bit position. Note that although the words "column" and "row" are used in this description, they are not meant to limit the actual orientation of the transmitter mini-bars and receiver mini-bars. Any arrangements of transmitter mini-bars and receiver mini-bars can be used as long as the arrangements are orthogonal to each other. In addition, the word "orthogonal" does not mean that the transmitter mini-bars must form an exact 90-degree angle with the receiver mini-bars. It suffices for alignment purposes that the transmitter mini-bars are in a different direction than the receiver mini-bars, so that compensation may occur in two different directions.

The amount of misalignment this arrangement can compensate for depends on how many signals a mini-bar can be switched to. If a transmitter/receiver mini-bar can be switched between two signals, then a transmitter/receiver bit position can be relocated within the area covered by two bit positions, which is over 12 mini-bars in this example. Similarly, if a mini-bar can be switched among three signals, then a bit position can be relocated within the area covered by three bit positions. To ensure reliable reception, the capacitance of the switching structures in the receiving chip ideally is sufficiently small.

An advantage of the present invention is that the signal-switching complexity for the mini-bar configuration is significantly reduced in comparison with that of the previously-described transmitter-pad array. In the example shown in FIG. 3, each bit position requires switching for 12 mini-bars (6 for transmission and 6 for receiving). In contrast, to obtain the same adjustment resolution, a transmitter-pad array configuration may use 36 transmitter pads on the transmitter chip for each bit position, which requires switching for 36 transmitter pads. The mini-bar configuration can reduce this switching overhead from $n^2$ to $2n$, where n denotes the number of mini-bars per bit position.

Because of the reduction in control lines for switching each mini-bar, it is possible to have a separate set of control wires for each column of horizontal mini-bars on the transmitting chip, or for each row of vertical mini-bars on the receiving chip. Such an arrangement permits each column or each row to select a different displacement for bit positions if desired.

Figure 4:
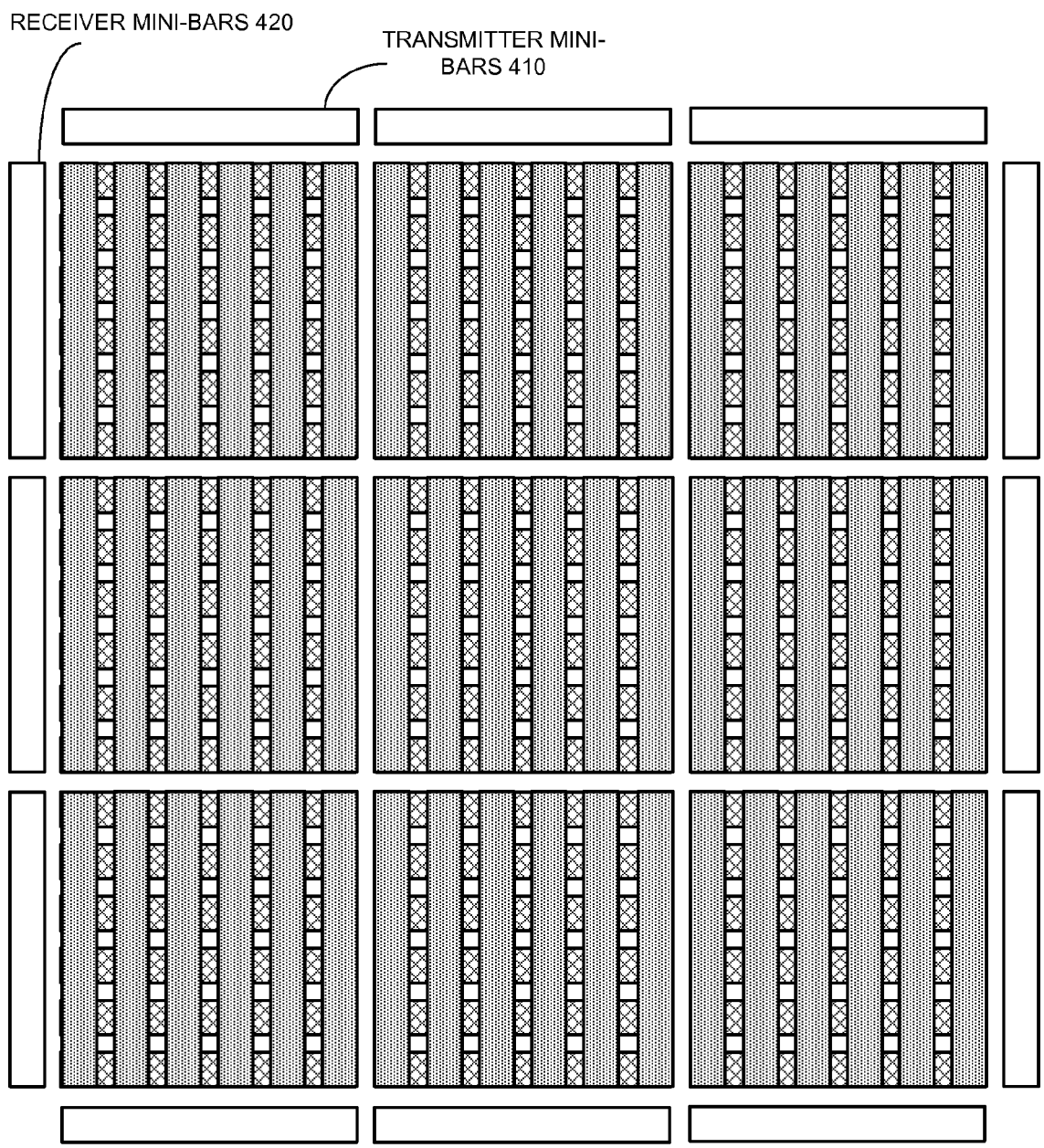
FIG. 4 illustrates aligned receiver mini-bars overlapping with transmitter mini-bars in accordance with an embodiment of the present invention.

FIG. 4 illustrates aligned receiver mini-bars overlapping with transmitter mini-bars in accordance with an embodiment of the present invention. In this example, transmitter mini-bars 410 are in the horizontal direction, and receiver mini-bars 420 are in the vertical direction. Every 6 receiver mini-bars are positioned squarely over every 6 transmitter mini-bars, resulting in nine bit positions. Note that in FIG. 4 activated transmitter mini-bars are highlighted with cross-hatching, and receiver mini-bars receiving signals are highlighted with dots. Idle mini-bars which do not transmit or receive signals, such as those on the periphery in FIG. 4, may be coupled to a fixed voltage (e.g., a power-supply voltage, or a ground voltage) to reduce interference.

Figure 5:
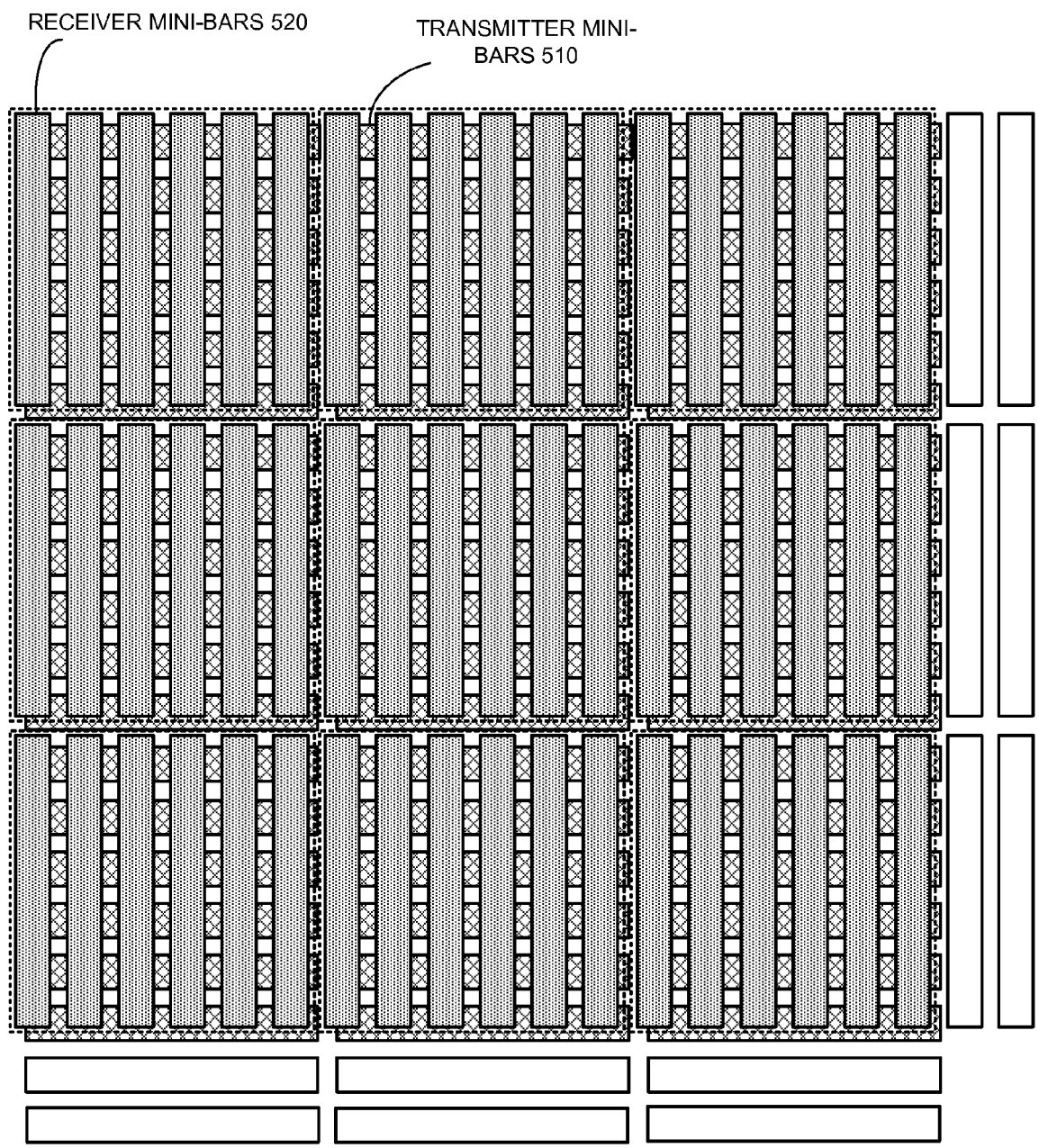
FIG. 5 illustrates compensation for lateral misalignment between receiver mini-bars and transmitter mini-bars in accordance with an embodiment of the present invention.

FIG. 5 illustrates compensation for lateral misalignment between receiver mini-bars and transmitter mini-bars in accordance with an embodiment of the present invention. In this example, transmitter mini-bars 510 are in the horizontal direction, and receiver mini-bars 520 are in the vertical direction. Compared with the example in FIG. 4, the receiver mini-bars in FIG. 5 are shifted to the right and upward with respect to the position of the transmitting mini-bars. To compensate for this misalignment, the receiving chip displaces the receiver bit positions (marked by dotted lines) towards left. Similarly, the transmitting chip displaces the transmitting bit positions upward. After these displacements, the idle receiver mini-bars are on the right, and idle transmitter mini-bars are on the bottom. Note that because the misalignment in this example is lateral, the bit-position displacements are uniform across the rows on the receiving chip, and uniform across the columns on the transmitting chip.

Figure 6:
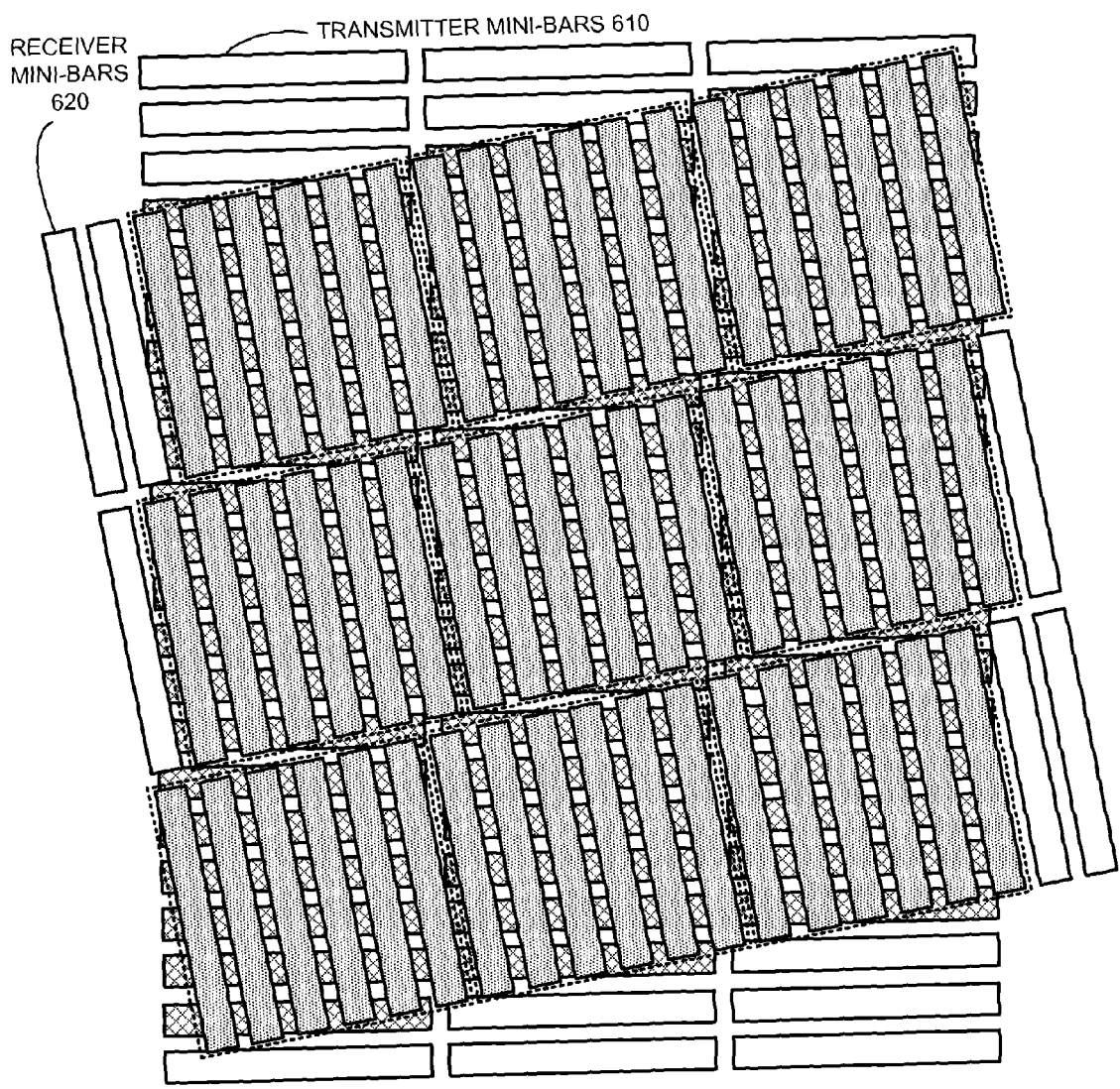
FIG. 6 illustrates compensation for rotational misalignment between receiver mini-bars and transmitter mini-bars in accordance with an embodiment of the present invention.

FIG. 6 illustrates compensation for rotational misalignment between receiver mini-bars and transmitter mini-bars in accordance with an embodiment of the present invention. In this example, transmitter mini-bars 610 are in the horizontal direction, and receiver mini-bars 620 are approximately in the vertical direction. Further, the receiving chip is rotated counter-clockwise with respect to the transmitting chip. To compensate for this rotational misalignment, the receiver bit positions on the receiving chip are displaced accordingly. Note that the misalignment is not uniform in the x or y direction. Consequently, the displacements of the receiver bit positions are not uniform across the rows in this case, because the amount of horizontal compensation in each row is different. Similarly, the displacements of the transmitter bit positions are not uniform across the columns. To compensate for rotational misalignment effectively, it is desirable to arrange additional mini-bars in the periphery so that a large rotational angle can be tolerated.

In the example in FIG. 6, several transmitter mini-bars also overlap with receiver mini-bars of a neighboring receiver bit position (such as the bottom transmitter mini-bars of each transmitter bit position). In operation, these small overlaps may create undesirable interferences with the neighboring bit positions. However, because the resolution of bit-position adjustment is one mini-bar position, the interference caused by such overlapping does not exceed ⅙ of the total signal strength (since there are 6 mini-bars in one bit position in this example). Therefore, the interference due to unwanted overlapping typically does not prevent reliable communication.

Note that the selection of mini-bars to form transmitter bit positions (on the transmitter chip) and receiver bit positions (on the receiver chip) as well as the association between transmitter and receiver bit positions can be based upon a measured alignment between the transmitter and receiver chips. This alignment can be measured using any one of a number of well-known manual and automatic measurement techniques. Alternatively, the selections and associations can be automatically performed by, for example, by placing the transmitter and receiver chips together, and then transmitting a pattern on a specific mini-bar on the transmitter chip and then determining which mini-bar(s) on the receiver chip receives the signal.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for electronically aligning mini-bars on different semiconductor chips which are situated face-to-face to facilitate communication between the semiconductor chips through capacitive coupling, the apparatus comprising:
- a measurement mechanism configured to measure an alignment between a first chip and a second chip;
- a transmitter mini-bar selection mechanism configured to select a group of transmitter mini-bars on the first chip to form a transmitter bit position based on the measured alignment, thereby allowing a data signal to be distributed to and transmitted by the mini-bars within the transmitter bit position;
- a receiver mini-bar selection mechanism configured to select a group of receiver mini-bars on the second chip to form a receiver bit position based on the measured alignment; and
- an association mechanism configured to associate transmitter bit positions on the first chip with proximate receiver bit positions on the second chip based on the measured alignment, thereby allowing data signals transmitted by the mini-bars that form a transmitter bit position on the first chip to be collectively received by the mini-bars within an associated receiver bit position on the second chip.

2. The apparatus of claim 1, further comprising a transmitter switching mechanism configured to switch data signals to associated transmitter bit positions on the first chip, so that the data signals are communicated through capacitive coupling to intended receiver bit positions on the second chip, which are proximate to the transmitter bit positions on the first chip.

3. The apparatus of claim 1, further comprising a receiver switching mechanism configured to switch data signals received by the receiver mini-bars to associated receiver circuits, so that data signals belonging to the same receiver bit position are received collectively.

4. The apparatus of claim 1,
- wherein the transmitter mini-bars on the first chip form a number of columns, each comprising multiple parallel mini-bars, thereby allowing the first chip to adjust the transmitter bit positions in the direction along the columns;
- wherein the receiver mini-bars on the second chip form a number of rows, each comprising multiple parallel mini-bars, thereby allowing the second chip to adjust the receiver bit positions in the direction along the rows; and
- wherein the apparatus further comprises an alignment mechanism configured to align the first chip and the second chip so that the transmitter mini-bars on the first chip are orthogonal to the receiver mini-bars on the second chip, thereby allowing the position of an overlap between a transmitter bit position and a receiver bit position to be adjusted in two orthogonal directions.

5. The apparatus of claim 4, wherein while selecting a group of transmitter mini-bars on the first chip to form the transmitter bit position, the transmitter mini-bar selection mechanism is configured to:
- assign a number of consecutive transmitter mini-bars within a column to the transmitter bit position; and
- to couple a data signal switched to the transmitter bit position to the group of consecutive transmitter mini-bars assigned to the transmitter bit position.

6. The apparatus of claim 4, wherein while selecting a group of receiver mini-bars on the second chip to form the receiver bit position, the receiver mini-bar selection mechanism is configured to assign a number of consecutive receiver mini-bars within a row to the receiver bit position.

7. The apparatus of claim 4, wherein the total number of transmitter mini-bars on the first chip exceeds the number of transmitter mini-bars selected to form transmitter bit positions, thereby providing room for relocating the transmitter bit positions; and
- wherein the apparatus further comprises a first coupling mechanism configured to couple transmitter mini-bars which are not selected to form a transmitter bit position to a fixed voltage, such as a power-supply voltage or a ground voltage.

8. The apparatus of claim 4, wherein the total number of receiver mini-bars on the second chip exceeds the number of receiver mini-bars selected to form receiver bit positions, thereby providing room for relocating the receiver bit positions; and
- wherein the apparatus further comprises a second coupling mechanism configured to couple receiver mini-bars which are not selected to form a receiver bit position to a fixed voltage, such as a power-supply voltage or a ground voltage.

* * * * *